United States Patent
Li et al.

(10) Patent No.: US 9,627,286 B1
(45) Date of Patent: Apr. 18, 2017

(54) PACKAGE STRUCTURE

(71) Applicant: PixArt Imaging Incorporation, HsinChu (TW)

(72) Inventors: Kuo-Hsiung Li, HsinChu (TW); Chi-Chih Shen, HsinChu (TW); Jui-Cheng Chuang, HsinChu (TW); Jen-Yu Chen, HsinChu (TW)

(73) Assignee: PIXART IMAGING INCORPORATION, Hsin-Chu (TW)

( * ) Notice: Subject to any disclaimer, the term of this patent is extended or adjusted under 35 U.S.C. 154(b) by 0 days.

(21) Appl. No.: 15/203,068

(22) Filed: Jul. 6, 2016

(30) Foreign Application Priority Data

Nov. 6, 2015 (TW) .............................. 104136576 A

(51) Int. Cl.
| | |
|---|---|
| *H01L 23/48* | (2006.01) |
| *H01L 23/52* | (2006.01) |
| *H01L 29/40* | (2006.01) |
| *H01L 23/16* | (2006.01) |
| *H01L 23/055* | (2006.01) |

(52) U.S. Cl.
CPC ............ *H01L 23/16* (2013.01); *H01L 23/055* (2013.01)

(58) Field of Classification Search
CPC .............................. H01L 23/16; H01L 23/055
USPC ........................................................ 257/774
See application file for complete search history.

(56) References Cited

U.S. PATENT DOCUMENTS

| | | | |
|---|---|---|---|
| 6,528,417 B1 * | 3/2003 | Wang | .................... H01L 21/563 257/E21.503 |
| 9,543,242 B1 * | 1/2017 | Kelly | ................ H01L 23/49816 |

* cited by examiner

*Primary Examiner* — David S Blum
(74) *Attorney, Agent, or Firm* — Tung & Associates

(57) ABSTRACT

The invention provides a package structure which includes a substrate, at least one chip module, and a housing. The at least one chip module is located on the substrate. The housing includes an upper cover, a surrounding wall, and at least one adhesion enhancement structure. The surrounding wall is connected to the upper cover and encompasses the at least one chip module. The surrounding wall and the adhesion enhancement structure are bonded to the substrate by an adhesive. The adhesion enhancement structure includes an encircled hole or a semi-encircled hole.

15 Claims, 6 Drawing Sheets

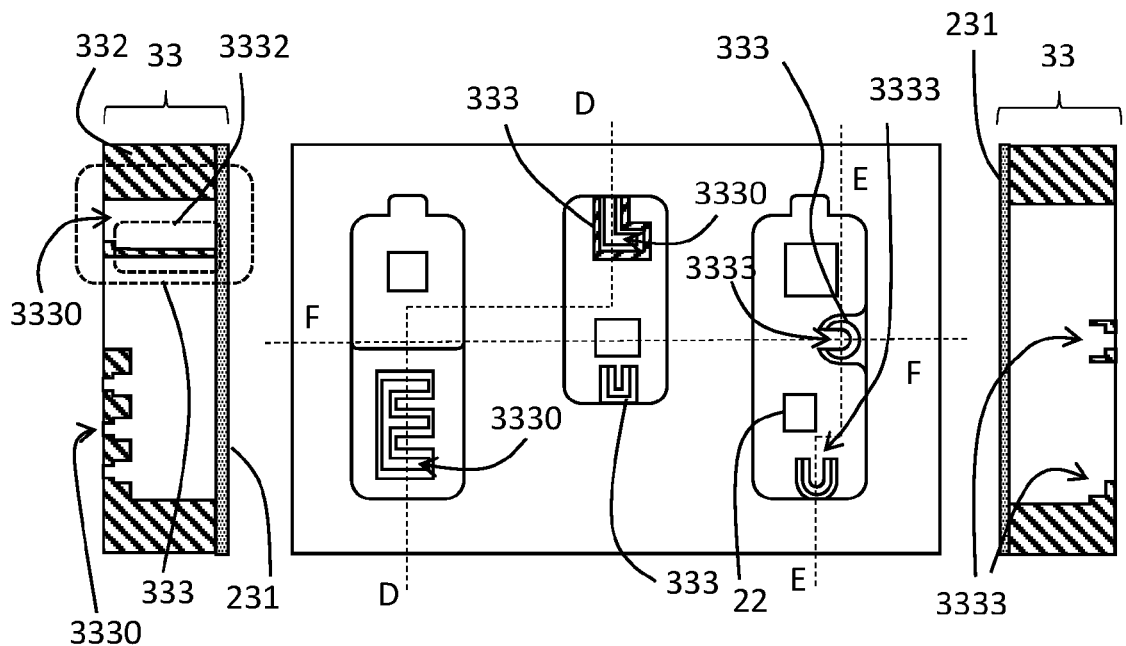
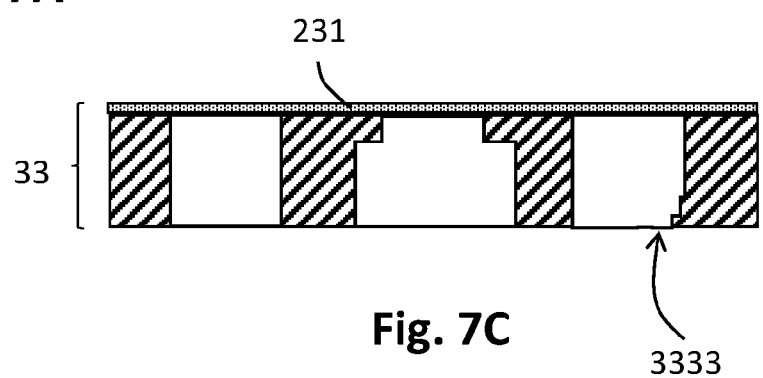
Fig. 7A  Fig. 6  Fig. 7B
Fig. 7C

PACKAGE STRUCTURE

CROSS REFERENCE

The present invention claims priority to TW 104136576, filed on Nov. 6, 2015.

BACKGROUND OF THE INVENTION

Field of Invention

The present invention relates to a package structure, in particular a package structure including at least one adhesion enhancement structure for increasing a bonding effect between a housing and a substrate of the package structure.

Description of Related Art

FIG. 1 shows a prior art package structure 10, which includes a substrate 11, at least one chip module 12, a housing 13, and an adhesive 14. The chip module 12 is located on the substrate 11, and the adhesive 14 bonds the housing 13 and the substrate 11 together.

In the prior art package structure 10, the housing 13 which encompasses the chip module 12 is bonded onto the substrate 11 by the adhesive 14; however, if the adhesive 14 is applied too much, it may adversely affect the appearance of the package structure 10, and if the adhesive 14 is applied too little, the housing 13 may be detached from the substrate 11 (peeling). Thus, the prior art package structure 10 is unsatisfactory.

In view of the demerits of the prior art, the present invention provides a package structure having at least one adhesion enhancement structure to enhance the bonding effect between the housing and the substrate, without adversely affecting the appearance of the package structure.

SUMMARY OF THE INVENTION

In one perspective, the present invention provides a package structure which includes a substrate, at least one chip module, and a housing. The at least one chip module is located on the substrate. The housing includes an upper cover, a surrounding wall, and at least one adhesion enhancement structure. The surrounding wall is connected to the upper cover and encompasses the at least one chip module. The surrounding wall and the adhesion enhancement structure are bonded to the substrate by an adhesive. The adhesion enhancement structure includes an encircled hole or a semi-encircled hole.

In one embodiment, the substrate includes a top surface, and the at least one chip module is located on the top surface of the substrate, wherein the at least one adhesion enhancement structure is directly or indirectly connected to the upper cover of the housing, and the surrounding wall and the at least one adhesion enhancement structure are bonded to the top surface of the substrate by the adhesive, and the at least one adhesion enhancement structure does not encompass the at least one chip module.

In one embodiment, the at least one adhesion enhancement structure includes a bottom portion configured to be bonded to the top surface of the substrate, wherein the bottom portion includes the encircled or semi-encircled hole.

In one embodiment, the at least one adhesion enhancement structure further includes a wall portion located on and connected to the bottom portion, wherein a projected area of the wall portion on the top surface of the substrate is smaller than a projected area of the bottom portion on the top surface of the substrate, and the projected area of the wall portion at least partially overlaps the projected area of the bottom portion.

In one embodiment, an inner radius of the encircled or semi-encircled hole is smaller than an inner radius of the wall portion.

In one embodiment, when the at least one adhesion enhancement structure is bonded to the top surface of the substrate by the adhesive, a portion of the adhesive is squeezed into the encircled or semi-encircled hole.

In one embodiment, when the at least one adhesion enhancement structure is bonded to the top surface of the substrate by the adhesive, a portion of the adhesive is squeezed out to reach an upper surface of the bottom portion.

In one embodiment, the bottom portion of the at least one adhesion enhancement structure has a projected area on the top surface of the substrate, the projected area having a shape which includes: an encircled rectangle, a semi-encircled rectangle, an encircled circle, a semi-encircled circle, an encircled ellipse, a semi-encircled ellipse, an encircled L-shape, a semi-encircled L-shape, an encircled U-shape, a semi-encircled U-shape, an encircled E-shape, a semi-encircled E-shape, or a combination of two or more of the above.

In one embodiment, the housing is made of a plastic material.

In one perspective, the present invention provides a package structure, which includes: a substrate, at least one chip module, and a housing. The at least one chip module is located on the substrate. The housing includes: an upper cover, and at least one adhesion enhancement structure connected to the upper cover. The at least one adhesion enhancement structure includes: a bottom portion connected to the substrate by an adhesive, and a wall portion having a lower end connected to the bottom portion and an upper end connected to the upper cover. A projected area of the wall portion on the substrate at least partially overlaps a projected area of the bottom portion on the substrate.

In one perspective, the present invention provides a package structure, which includes: a substrate which includes a top surface; at least one chip module, located on the substrate; and a housing for covering the at least one chip module, the housing including at least one adhesion enhancement structure which includes a lower surface and an upper surface opposite to the lower surface, wherein the lower surface of the adhesion enhancement structure is bonded to the top surface of the substrate by an adhesive, and the upper surface of the adhesion enhancement structure is at least partially adhered with a portion of the adhesive.

The objectives, technical details, features, and effects of the present invention will be better understood with regard to the detailed description of the embodiments below, with reference to the drawings.

BRIEF DESCRIPTION OF THE DRAWINGS

FIGS. 6, 7A-7C, 8, and 9A-9C show a package structure according to other embodiments of the present invention.

DESCRIPTION OF THE PREFERRED EMBODIMENTS

The drawings as referred to throughout the description of the present invention are for illustrative purpose only, to show the interrelations between the components, but not drawn according to actual scale. The shape, thickness and width of a component can be modified during implementation.

Figure 1:
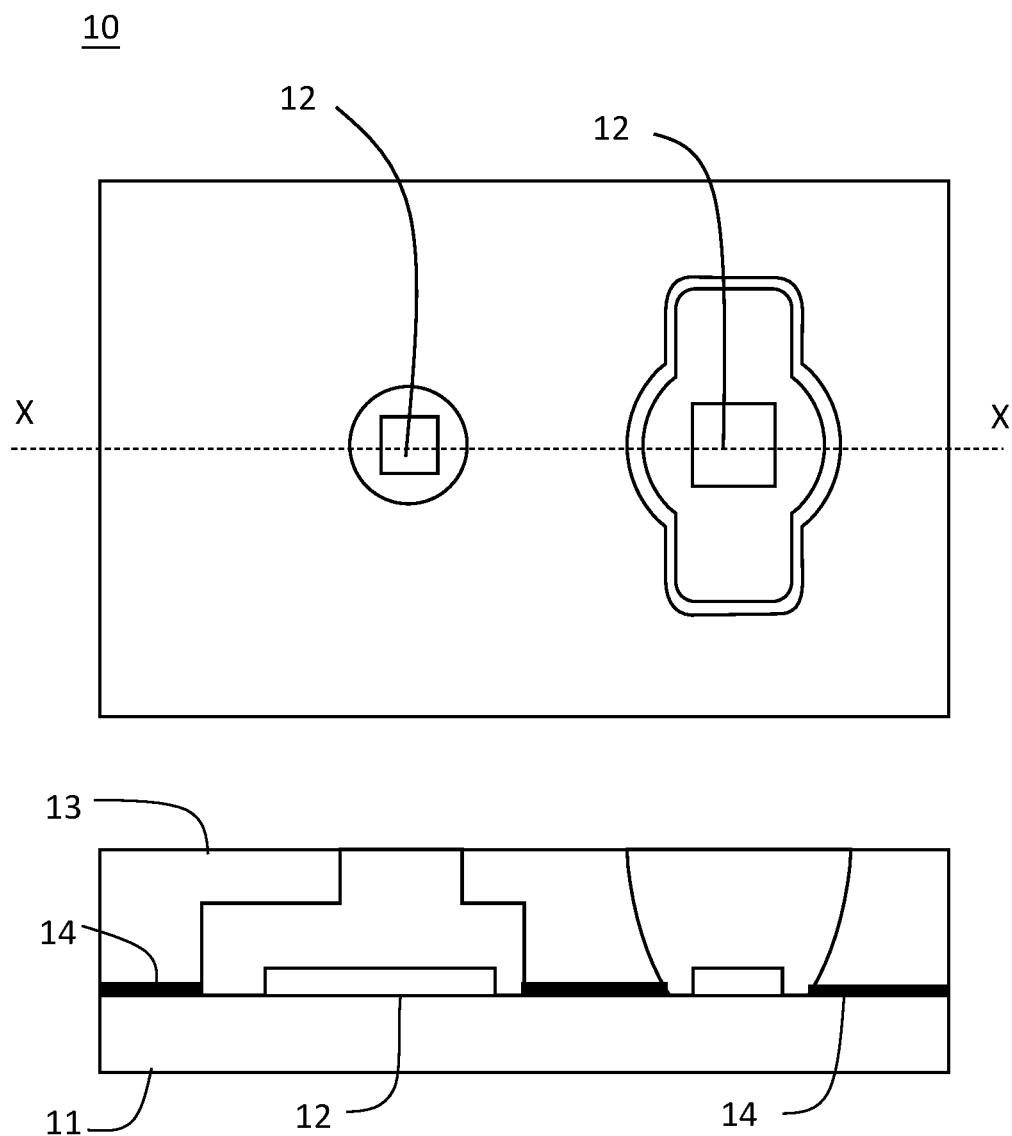
FIG. 1 shows prior art package structure.
Figures 2, 3A, 3B:
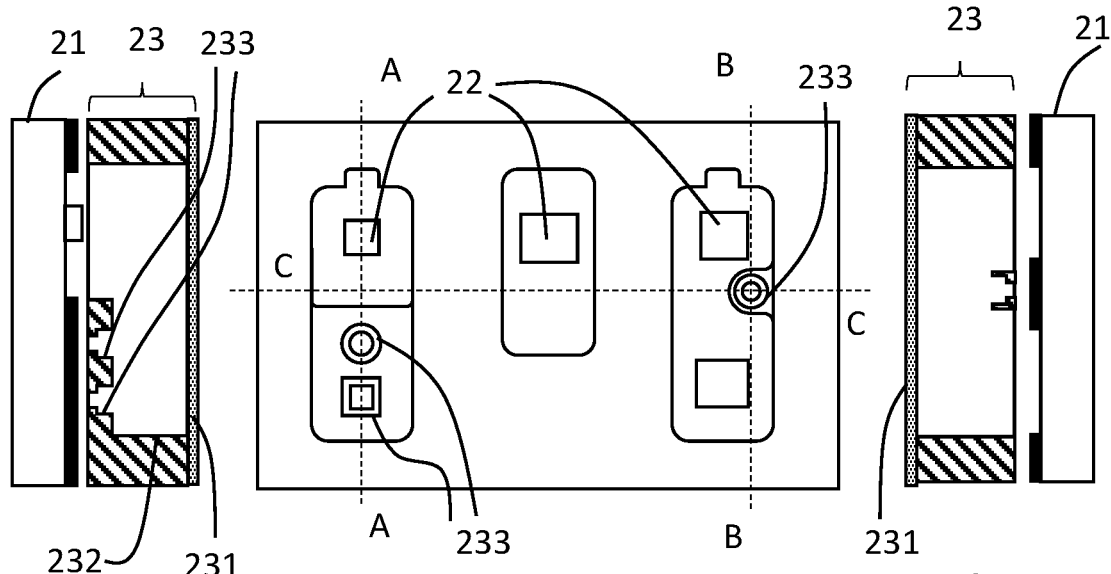
FIGS. 2, 3A-3D, 4, and 5A-5C show a package structure according to one embodiment of the present invention.
Figure 3C:
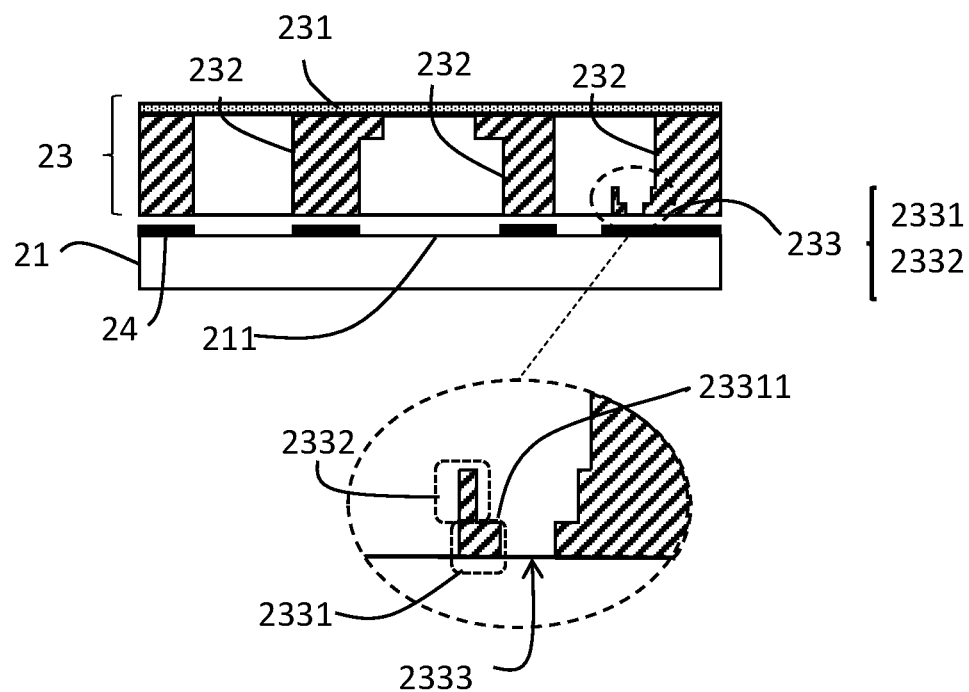
Figure 3D:
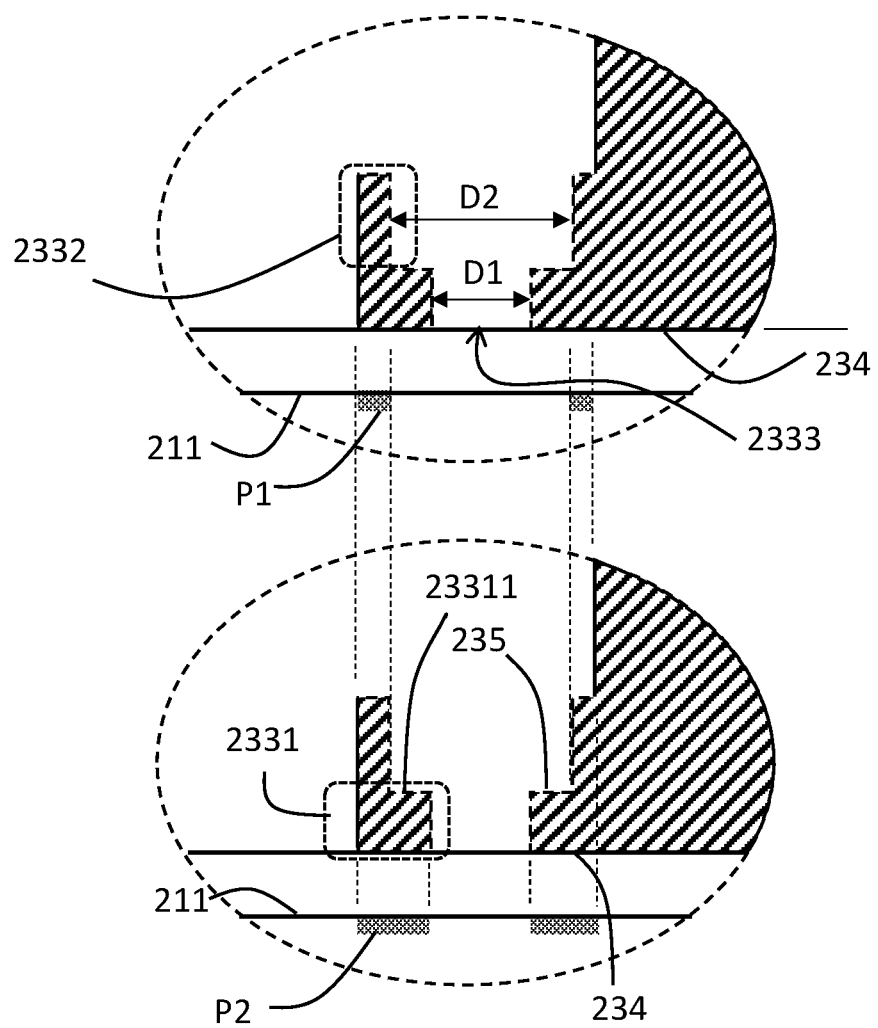
Figures 4, 5A, 5B:
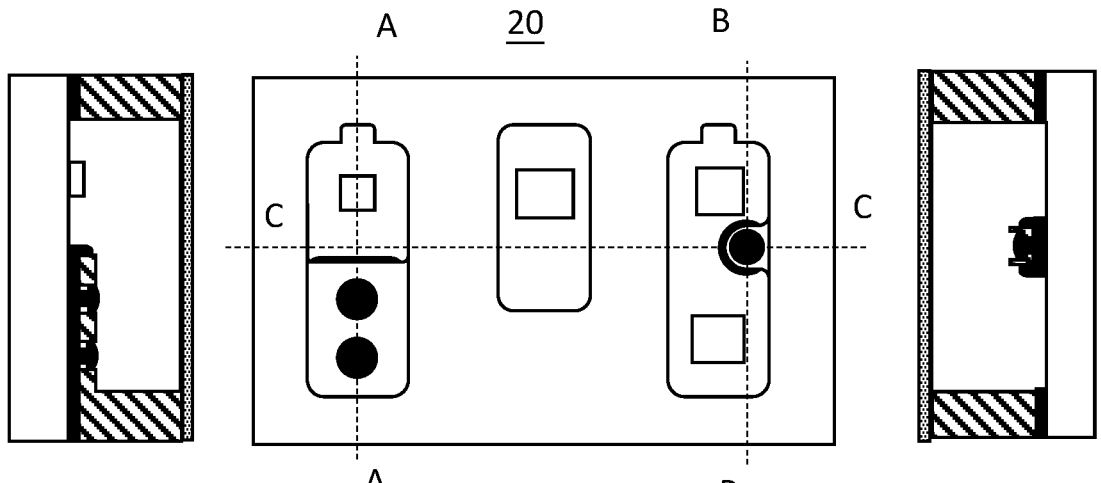
Figure 5C:
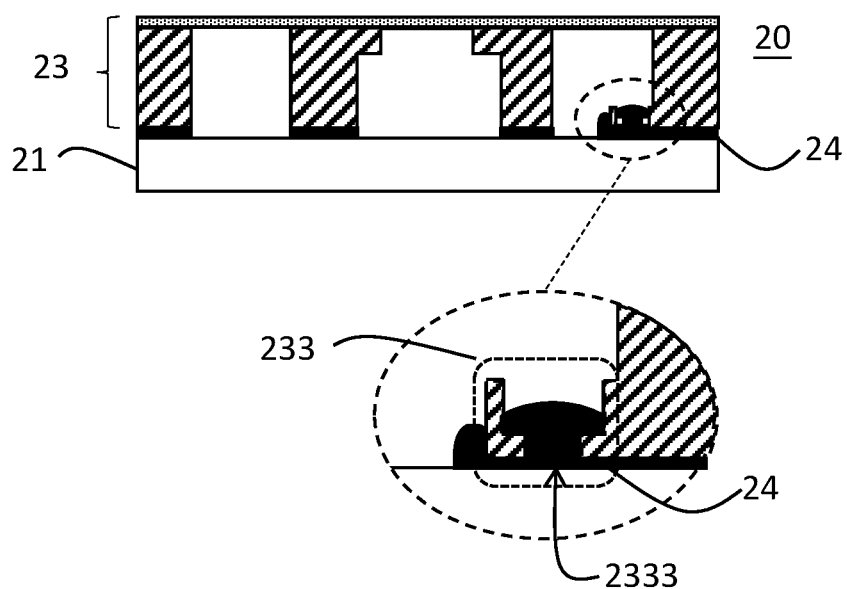

FIGS. 2, 3A-3D, 4, and 5A-5C show a package structure 20 according to one embodiment of the present invention. FIG. 2 shows a top view of the housing 23 and the substrate 21, before the housing 23 and the substrate 21 are bonded together. FIG. 4 shows a top view of the package structure 20, after the housing 23 and the substrate 21 are bonded together to form the package structure 20. FIGS. 3A-3C show cross-section views respectively according to the cross-section lines AA, BB, and CC shown in FIG. 2. FIG. 3D is a partial enlarged view according to FIG. 3C. FIGS. 5A-5C show cross-section views respectively according to the cross-section lines AA, BB, and CC shown in FIG. 4.

As shown in FIGS. 2 and 3A-3C, the package structure 20 includes: a substrate 21, at least one chip module 22, and a housing 12. The substrate 21 includes a top surface 211. The at least one chip module 22 is located on the top surface 211 of the substrate 21. The housing 23 includes an upper cover 231, at least one surrounding wall 232 (connected to the upper cover 231 and encompassing the at least one chip module 22), and at least one adhesion enhancement structure 233 directly or indirectly connected to the upper cover 231. The surrounding wall 232 and the at least one adhesion enhancement structure 233 are bonded to the top surface 211 of the substrate 21 by an adhesive 24. The at least one adhesion enhancement structure 233 is designed for enhancing a bonding effect between the substrate 21 and the housing 23, wherein the surrounding wall 232 is configured to encompass the chip module 22, but the adhesion enhancement structure 233 is not configured to encompass the chip module 22 (that is, the adhesion enhancement structure 233 does not encompass the chip module 22).

As shown in FIG. 3C, the at least one adhesion enhancement structure 233 includes a bottom portion 2331, and there is a hole 2333 in the bottom portion 2331. In the embodiment of FIG. 3C, the hole 2333 can be an encircled hole. In another embodiment, the hole can be a semi-encircled hole (to be further explained later). Please refer to FIGS. 3C and 5C, the hole 2333 provides the effect that: when the adhesion enhancement structure 233 is bonded to the top surface 211 of the substrate 21 by the adhesive 24, a portion of the adhesive 24 is squeezed out of the hole 2333 to reach an upper surface 23311 of the bottom portion 2331, such that an undercut structure is formed. The undercut structure can enhance the bonding effect between the housing 23 and the substrate 21. Because a portion of the adhesive 24 forms the undercut structure, at least a portion of the upper surface 23311 is directly bonded to the adhesive 24, to enhance the bonding effect besides the bonding between a bottom surface 234 of the adhesion enhancement structure 233 and the top surface 211 of the substrate 21. Therefore, in comparison with the prior art, the bonded area of the present invention is larger, and furthermore, the housing 23 is bonded to the substrate 21 at two sides (the adhesion enhancement structure 233 is bonded at its upper surface 23311 and at its bottom surface 234), which provides a more robust protection against peeling. It should be explained that, the undercut structure formed by the portion of the adhesive 24 is preferred but not necessary. If the adhesive 24 is applied less such that the adhesive 24 is only squeezed into the hole 2333 but does not reach the upper surface 23311 of the bottom portion 2331, the bonding effect between the housing 23 and the substrate 21 is still enhanced as compared to the prior art, because there is a portion of the adhesive 24 bonding the inner wall of the hole 2333.

In the embodiment shown in FIGS. 2 and 3A-3C, each adhesion enhancement structure 233 is connected to the surrounding wall 232, and indirectly connected to the upper cover 231 through the surrounding wall 232. In another embodiment, the adhesion enhancement structures 233 can all be directly connected to the upper cover 231, or some of the adhesion enhancement structures 233 can be directly connected to the upper cover 231 (to be further explained later).

Please refer to FIG. 3C; in one embodiment, the adhesion enhancement structure 233 includes a bottom portion 2331 and a wall portion 2332, wherein a lower end of the wall portion 2332 is connected to the upper surface 23311 of the bottom portion 2331. The bottom portion 2331 is bonded to the top surface 211 by the adhesive 24. As shown in FIG. 3D, the wall portion 2332 of the adhesive enhancement structure 233 has a projected area P1 on the top surface 211, and the bottom portion 2331 has a projected area P2 on the top surface 211. From a direction of view which is normal to the substrate 21, the projected area P1 is smaller than the projected area P2, and an inner radius D1 of the hole 2333 is smaller than an inner radius D2 of the wall portion 2332. The wall portion 2332 provides an effect to limit the range of the adhesive 24 when the adhesive 24 is applied too much, such that the excess adhesive 24 does not affect the chip module 22. The design of the wall portion 2332 is preferred but not necessary; that is, if the adhesion enhancement structure 233 only includes the bottom portion 2331, without the wall portion 2332, it can still provide a better bonding effect over the prior art. In addition, the cross-sectional shapes of the bottom portion 2331 and the wall portion 2332 are not necessarily rectangles as shown in the figure; for example, the cross-sectional shapes can be trapezoids or other shapes.

Figure 9A:
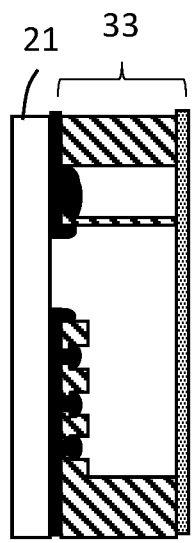
Figure 8:
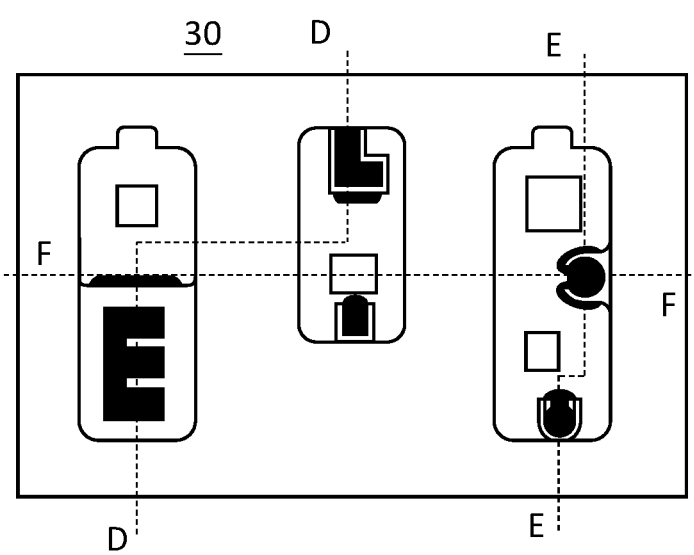
Figure 9B:
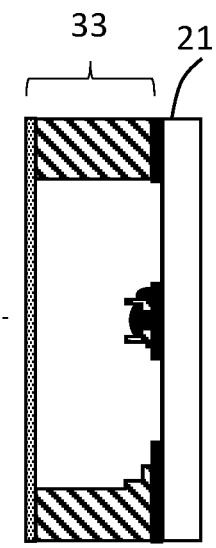
Figure 9C:
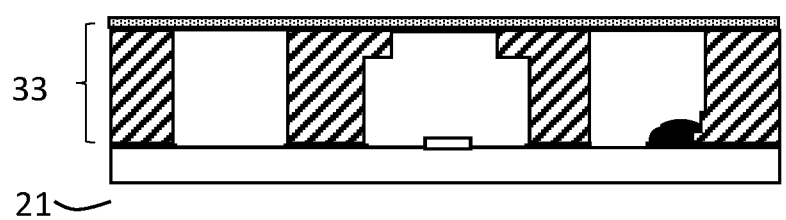

FIGS. 6, 7A-7C, 8, and 9A-9C show a package structure 30 according to other embodiments of the present invention. FIG. 6 shows a top view of the housing 33 and the substrate 21, before the housing 33 and the substrate 21 are bonded by the adhesive 24. FIG. 8 shows a top view of the housing 33 and the substrate 21 after the housing 33 and the substrate 21 are bonded by the adhesive 24 to constitute the package structure 30. FIGS. 7A-7C show cross-section views according to the cross-section lines DD, EE, and FF shown in FIG. 6. FIGS. 9A-9C show cross-section views according to the cross-section lines DD, EE, and FF shown in FIG. 8. To simply the figures, in FIGS. 7A-7C, the housing 33 is shown but the substrate 21 is omitted.

As shown in FIGS. 6 and 7A-7C, the holes in the bottom portion of the adhesion enhancement structures 333 can be encircled holes 3330 or semi-encircled holes 3333. An "encircled hole 3330" means that the hole is fully encompassed by the bottom portion of the adhesion enhancement structure 333. A "semi-encircled hole 3333" means that the hole is partially encompassed by the bottom portion of the adhesion enhancement structure 333. In case of the semi-encircled hole 3333, preferably, the bottom portion of the adhesion enhancement structure 333 encompasses at least a half of the periphery of the semi-encircled hole 3333. This and the previous embodiments show that, according to the present invention, the wall portion or the bottom portion of the adhesion enhancement structure 333 has a projected area on the top surface of the substrate, and the projected area can have a shape such as the followings: an encircled rectangle, a semi-encircled rectangle, an encircled circle, a semi-encircled circle, an encircled ellipse, a semi-encircled ellipse, an encircled L-shape, a semi-encircled L-shape, an encircled U-shape, a semi-encircled U-shape, an encircled E-shape, a semi-encircled E-shape, or a combination of two or more of the above.

According to one embodiment shown in FIG. 7A, the wall portion 3332 of the adhesion enhancement structure 333 can be directly connected to the upper cover 231, that is, the wall portion 3332 is not indirectly connected to the upper cover 231 through the surrounding wall 332. In this embodiment, all or some of the wall portions 3332 can be directly connected to the upper cover 231. From one perspective, this embodiment can be regarded as that: the adhesion enhancement structure 333 does not include the surrounding wall 332, but the adhesion enhancement structure 333 and the surrounding wall 322 together form the encircled hole 3330. Or, from another perspective, this embodiment can be regarded as that: the adhesion enhancement structure 333 includes a portion of the surrounding wall 332; one side of the adhesion enhancement structure 333 is the surrounding wall 332, but this side of the adhesion enhancement structure 333 does not have the aforementioned bottom portion and wall portion. Thus, that "the adhesion enhancement structure includes a bottom portion" can be embodied by providing a bottom portion completely surrounding the inner side of the adhesion enhancement structure, or embodied by providing a bottom portion which only partially surrounds the inner side of the adhesion enhancement structure.

In one embodiment, the housings 23 and 33 can be made of a plastic material, e.g., LCP (Liquid Crystal Plastic) or other plastic materials. In another embodiment, the housings 23 and 33 can be made of other materials such as a ceramic material.

In one embodiment, besides a flat surface, the surface (top, side and/or bottom surface) of the adhesive enhancement structures 233 and 333 can include a convex structure, a recess structure, or a combination of a convex structure and a recess structure.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. Besides, an embodiment or a claim of the present invention does not need to attain or include all the objectives, advantages or features described in the above. The abstract and the title are provided for assisting searches and not to be read as limitations to the scope of the present invention.

What is claimed is:

1. A package structure, comprising:
a substrate;
at least one chip module, located on the substrate; and
a housing, including an upper cover, a surrounding wall connected to the upper cover and encompassing the at least one chip module, and at least one adhesion enhancement structure, wherein the surrounding wall and the adhesion enhancement structure are bonded to the substrate by an adhesive, and the adhesion enhancement structure includes an encircled or semi-encircled hole.

2. The package structure of claim 1, wherein the substrate includes a top surface, and the at least one chip module is located on the top surface of the substrate, wherein the at least one adhesion enhancement structure is directly or indirectly connected to the upper cover of the housing, and the surrounding wall and the at least one adhesion enhancement structure are bonded to the top surface of the substrate by the adhesive, and the at least one adhesion enhancement structure does not encompass the at least one chip module.

3. The package structure of claim 2, wherein the at least one adhesion enhancement structure includes a bottom portion configured to be bonded to the top surface of the substrate, wherein the bottom portion includes the encircled or semi-encircled hole.

4. The package structure of claim 3, wherein the at least one adhesion enhancement structure further includes a wall portion located on and connected to the bottom portion, wherein a projected area of the wall portion on the top surface of the substrate is smaller than a projected area of the bottom portion on the top surface of the substrate, and the projected area of the wall portion at least partially overlaps the projected area of the bottom portion.

5. The package structure of claim 4, wherein an inner radius of the encircled or semi-encircled hole is smaller than an inner radius of the wall portion.

6. The package structure of claim 2, wherein when the at least one adhesion enhancement structure is bonded to the top surface of the substrate by the adhesive, a portion of the adhesive is squeezed into the encircled or semi-encircled hole.

7. The package structure of claim 3, wherein when the at least one adhesion enhancement structure is bonded to the top surface of the substrate by the adhesive, a portion of the adhesive is squeezed out to reach an upper surface of the bottom portion.

8. The package structure of claim 3, wherein the bottom portion of the at least one adhesion enhancement structure has a projected area on the top surface of the substrate, the projected area having a shape which includes: an encircled rectangle, a semi-encircled rectangle, an encircled circle, a semi-encircled circle, an encircled ellipse, a semi-encircled ellipse, an encircled L-shape, a semi-encircled L-shape, an encircled U-shape, a semi-encircled U-shape, an encircled E-shape, a semi-encircled E-shape, or a combination of two or more of the above.

9. A package structure, comprising:
a substrate;
at least one chip module, located on the substrate; and
a housing, including an upper cover, and at least one adhesion enhancement structure connected to the upper cover, wherein the at least one adhesion enhancement structure includes: a bottom portion connected to the substrate by an adhesive, and a wall portion having a lower end connected to the bottom portion and an upper end connected to the upper cover;
wherein a projected area of the wall portion on the substrate at least partially overlaps a projected area of the bottom portion on the substrate.

10. The package structure of claim 9, wherein the bottom portion of the at least one adhesion enhancement structure includes an encircled or semi-encircled hole.

11. The package structure of claim 10, wherein an inner radius of the encircled hole or the semi-encircled hole is smaller than an inner radius of the wall portion.

12. The package structure of claim 10, wherein when the at least one adhesion enhancement structure is bonded to the top surface of the substrate by the adhesive, a portion of the adhesive is squeezed into the encircled or semi-encircled hole.

13. The package structure of claim 9, wherein when the at least one adhesion enhancement structure is bonded to the top surface of the substrate by the adhesive, a portion of the adhesive is squeezed out to reach an upper surface of the bottom portion.

14. The package structure of claim 9, wherein the bottom portion of the at least one adhesion enhancement structure has a projected area on the top surface of the substrate, the projected area having a shape which includes: an encircled rectangle, a semi-encircled rectangle, an encircled circle, a semi-encircled circle, an encircled ellipse, a semi-encircled ellipse, an encircled L-shape, a semi-encircled L-shape, an encircled U-shape, a semi-encircled U-shape, an encircled E-shape, a semi-encircled E-shape, or a combination of two or more of the above.

15. A package structure, comprising:
   a substrate which includes a top surface;
   at least one chip module, located on the substrate; and
   a housing for encompassing the at least one chip module, the housing including at least one adhesion enhancement structure which includes a lower surface and an upper surface opposite to the lower surface, wherein the lower surface of the adhesion enhancement structure is bonded to the top surface of the substrate by an adhesive, and the upper surface of the adhesion enhancement structure is at least partially adhered with a portion of the adhesive.

* * * * *